(12) United States Patent
Kim

(10) Patent No.: US 6,301,165 B1
(45) Date of Patent: Oct. 9, 2001

(54) APPARATUS AND METHOD FOR DETECTING FAULTY OF CELLS IN A SEMICONDUCTOR MEMORY DEVICE

(75) Inventor: Jin-sung Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/660,103

(22) Filed: Sep. 12, 2000

(30) Foreign Application Priority Data

Sep. 14, 1999 (KR) .................................................. 99-39338

(51) Int. Cl.[7] ....................................................... G11C 7/00
(52) U.S. Cl. ............................ 365/200; 365/201; 365/210
(58) Field of Search ..................................... 365/201, 200, 365/210; 714/7, 8

(56) References Cited

U.S. PATENT DOCUMENTS

| | | | |
|---|---|---|---|
| 5,034,923 | * 7/1991 | Kuo et al. | 365/189.01 |
| 5,528,553 | * 6/1996 | Saxena | 365/230.01 |
| 5,606,527 | 2/1997 | Kwack et al. | 365/201 |
| 5,757,816 | 5/1998 | Al-Assadi et al. | 371/21.1 |
| 5,822,258 | 10/1998 | Casper | 365/201 |
| 6,058,056 | * 5/2000 | Beffa et al. | 365/201 |
| 6,085,334 | * 7/2000 | Giles et al. | 714/7 |
| 6,088,274 | * 7/2000 | Dorney et al. | 365/201 |

* cited by examiner

*Primary Examiner*—Son T. Dinh
(74) *Attorney, Agent, or Firm*—Mills & Onello, LLP

(57) ABSTRACT

A circuit and method for detecting faulty cells in a semiconductor memory device and a method therefor are provided. The circuit includes a memory cell array which includes a plurality of memory blocks, each of which includes a plurality of memory cells addressed corresponding to predetermined memory addresses and a plurality of faulty cell detectors corresponding to the plurality of memory blocks. The plurality of faulty cell detectors compare currents generated in the memory blocks to a predetermined reference current and detect whether addressed memory cells are faulty. It is possible to check whether the addressed memory cells are faulty by detecting the currents which flow through the plurality of memory blocks by the memory addresses. Therefore, it is possible to correctly detect the positions of faulty memory cells. Also, it is possible to reduce the number of pins since, data indicating whether the memory cells are faulty is output through data input and output lines in response to a test selection signal. Also, it is possible to prevent the operation speed of a chip from decreasing due to the current detectors during a normal operation since the current detectors corresponding to the memory blocks are bypassed in response to the test selection signal during the normal operation.

6 Claims, 4 Drawing Sheets

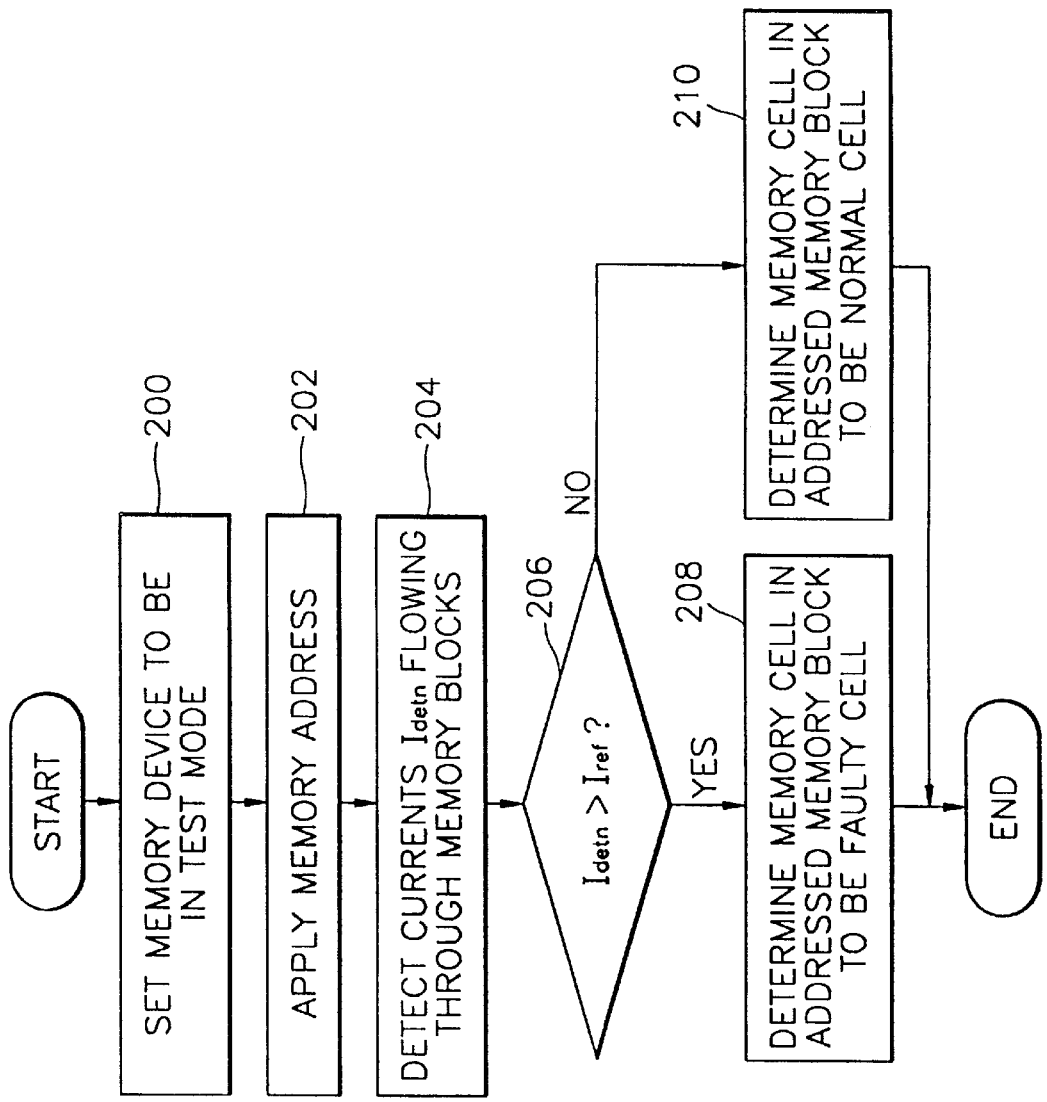

Figure 1:
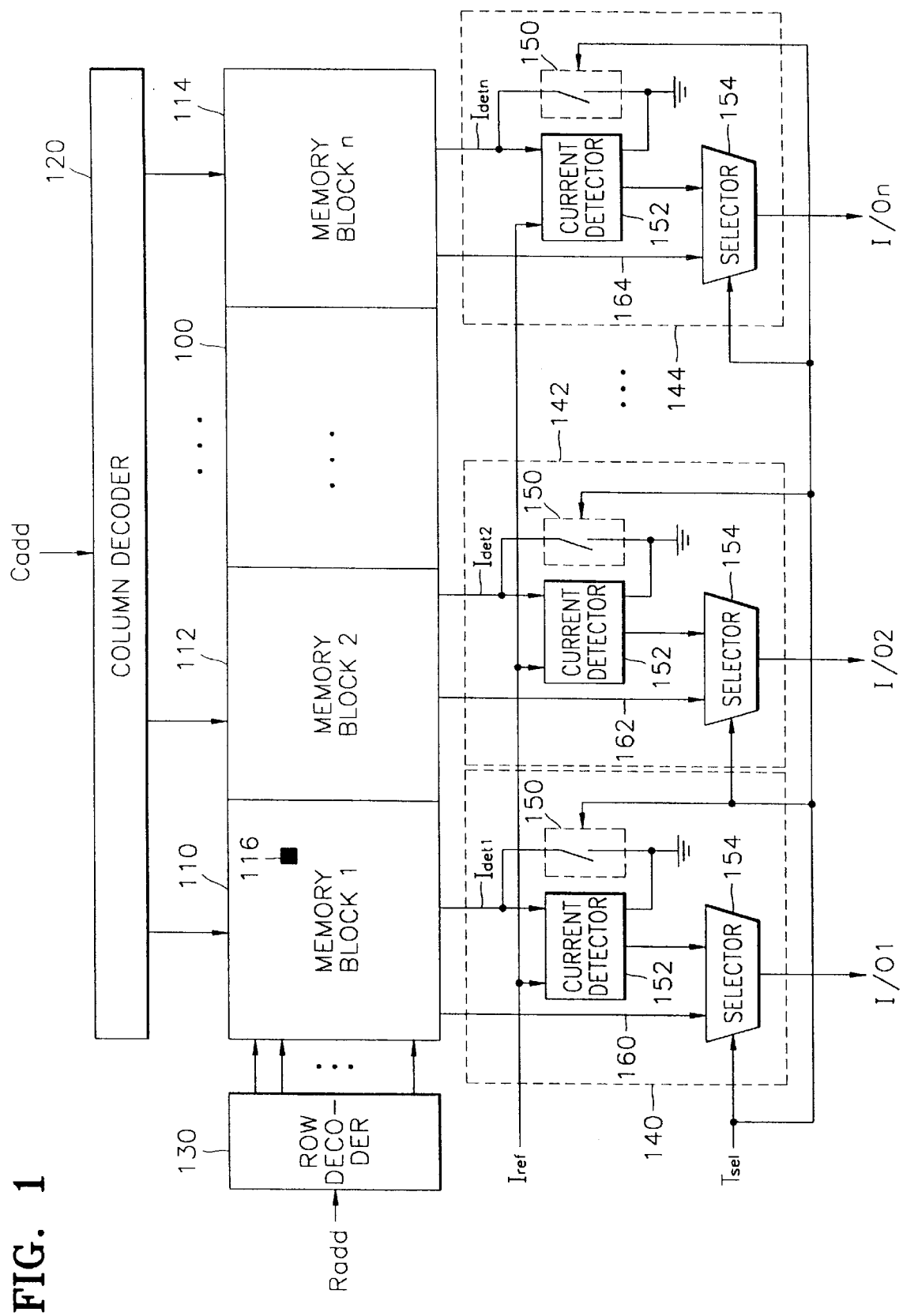

APPARATUS AND METHOD FOR DETECTING FAULTY OF CELLS IN A SEMICONDUCTOR MEMORY DEVICE

BACKGROUND OF THE INVENTION

1. Field of the Invention

The present invention relates to a semiconductor memory device, and more particularly, to an apparatus and a method for detecting faulty cells in a semiconductor memory device.

2. Description of the Related Art

Due to the development of very large scale integration (VLSI) technology, the integration density and the operating speed of chips is increasing. Also, in order to reduce the area of chips, a narrow line width technology has been adopted. As a result, more cells can be integrated in the same chip area. Techniques for testing whether faults exist in chips have been a matter of concern as VLSI technology has developed.

Various causes of faults in a VLSI circuit can be simply modeled. Among fault models of VLSI circuits, the most common one is a stuck-at fault model. Using the stuck-at fault model, it is possible to detect a logic operation fault, where the logic level of a node in the circuit is "stuck at" a logic "0" or "1". However, it is difficult to detect a parametric fault or a transient fault, which prohibit the normal operation of chips by affecting delay time, using the stuck-at fault model. Therefore, a current test is used in order to detect these faults.

It is possible to detect whether faults exist in the circuit by the current test using a phenomenon in which excessive current is generated in the circuit due to the parametric fault or the transient fault. The current test can be classified as an on-chip test or an off-chip test, depending upon whether a current detector for detecting current in the circuit is loaded into the chip. In the on-chip test, it is determined by the built-in current detector whether the chip is faulty. In the off-chip test, it is determined whether the chip is faulty using a current detector included in external test equipment.

However, in the case of the off-chip test performed using the test equipment, current generated in the tested chip is transmitted to the test equipment through the output pin of the tested chip. Accordingly, current resolution may deteriorate. Also, when the operating speed of the test equipment is lower than the operating speed of the tested chip, current detection speed decreases. Accordingly it takes longer to test the chip.

The on-chip test is mainly used for a test for detecting faulty cells in a semiconductor memory device. In the case of the on-chip test, since the current detector is integrated into the tested chip, current is analyzed in the tested chip and the analysis result is output. Therefore, the degree of correctness in detecting faults increases. Also, since the test speed of the on-chip test corresponds to the operating speed of the tested chip, the test speed significantly increases. However, in the on-chip test, the layout area of the tested chip increases and the normal operating speed of the chip may decrease, due to the integrated current detector.

Therefore, a minimum number of current detectors must be used when the circuit is designed for performing the on-chip test. According to the conventional circuit for detecting faulty cells in the semiconductor memory device, the number of current detectors is restricted. As a result, although it is possible to detect whether faulty cells exist, it is difficult to detect the correct positions of the faulty cells.

SUMMARY OF THE INVENTION

To solve the above problem, it is an object of the present invention to provide an apparatus and method for detecting faulty cells in a semiconductor memory device, using a minimum number of built-in current detectors, the apparatus being capable of correctly detecting whether faulty memory cells exist and where the faulty memory cells are located, and for minimizing the decrease in the operating speed of a tested chip due to the built-in current detectors during a normal operation.

In accordance with the invention, there is provided an apparatus for detecting faulty cells in a semiconductor memory device. The apparatus includes a memory cell array comprising a plurality of memory blocks, each of which comprises a plurality of memory cells which are addressable by predetermined corresponding memory addresses. A plurality of faulty cell detectors correspond to the plurality of memory blocks. The plurality of faulty cell detectors compare currents generated in the memory blocks to a predetermined reference current and detect whether addressed memory cells are faulty.

In one embodiment, the outputs of the plurality of faulty cell detectors are provided through data input and output lines in response to a test selection signal.

In one embodiment, each of the faulty cell detectors includes a current detector for detecting current flowing through the memory block according to the memory address. The current detector compares the magnitude of the detected current with the magnitude of the reference current and provides the result of the comparison as an output. In this embodiment, a selector receives data read from the bitline of the addressed memory cell according to the memory address. The selector receives the comparison result from the current detector and provides one of the read data and the comparison result of the current detector as an output in response to the test selection signal. In one particular embodiment, each of the faulty cell detectors also includes a switch for bypassing the current detectors corresponding to the memory blocks in response to the test selection signal.

In another aspect, the invention is directed to a method of detecting faulty cells in a semiconductor memory device which includes memory cell arrays, each of which includes a plurality of memory blocks, each of which includes a plurality of memory cells addressable by predetermined corresponding memory addresses. In accordance with the method, the memory device is set to be in a test mode, and the memory addresses are applied to the memory device. Currents flowing through the plurality of memory blocks are detected by memory cells addressed according to the memory addresses. It is determined whether the detected currents are larger than reference current. A memory cell in a memory block addressed by a memory address is determined to be faulty if the detected current is determined to be larger than the reference current. A memory cell in a memory block addressed by a memory address is determined to be a normal cell if the detected current is determined to be less than or equal to the reference current.

In one embodiment, the result of the determination as to whether a cell is faulty or normal is provided as an output through data input and output lines of the memory device.

BRIEF DESCRIPTION OF THE DRAWING(S)

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 1 contains a schematic circuit diagram which illustrates an apparatus for detecting faulty cells in a semiconductor memory device according to an embodiment of the present invention.

Figure 2:
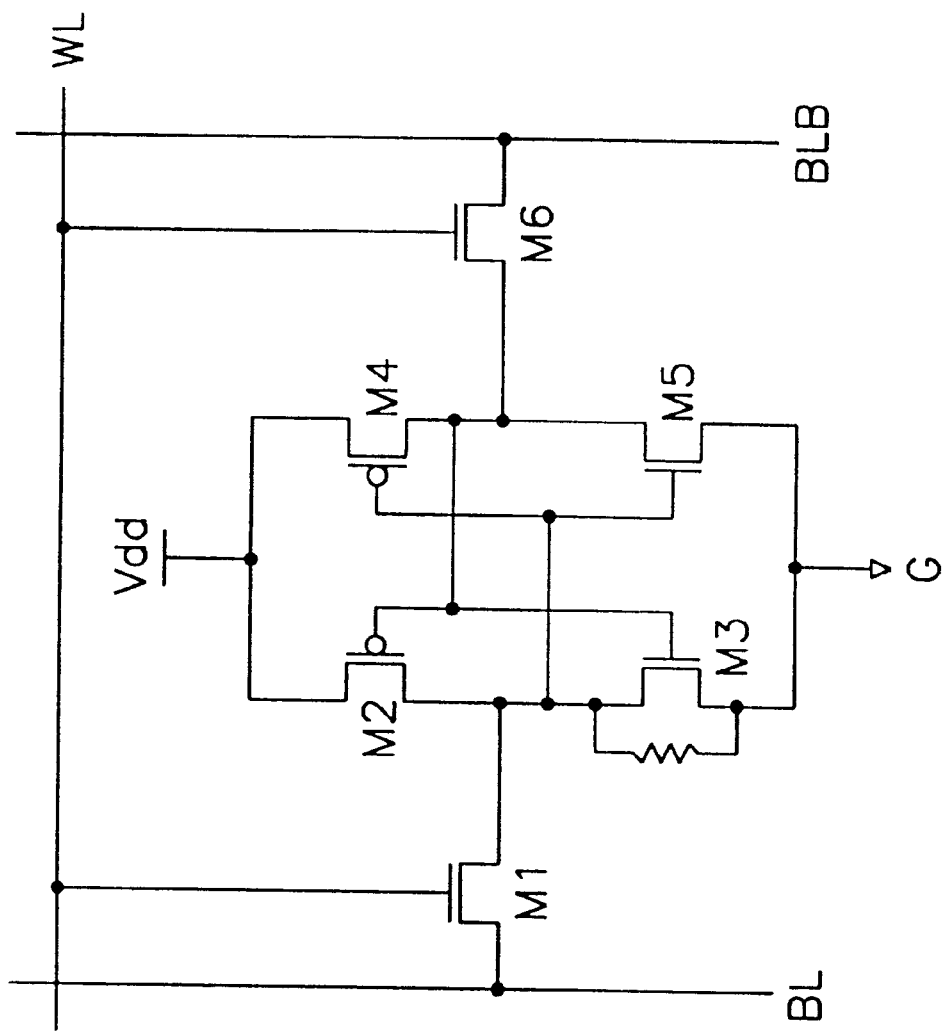

FIG. 2 is a schematic circuit diagram showing a memory cell of which an SRAM memory cell array can be made, in accordance with the invention.

Figure 3:
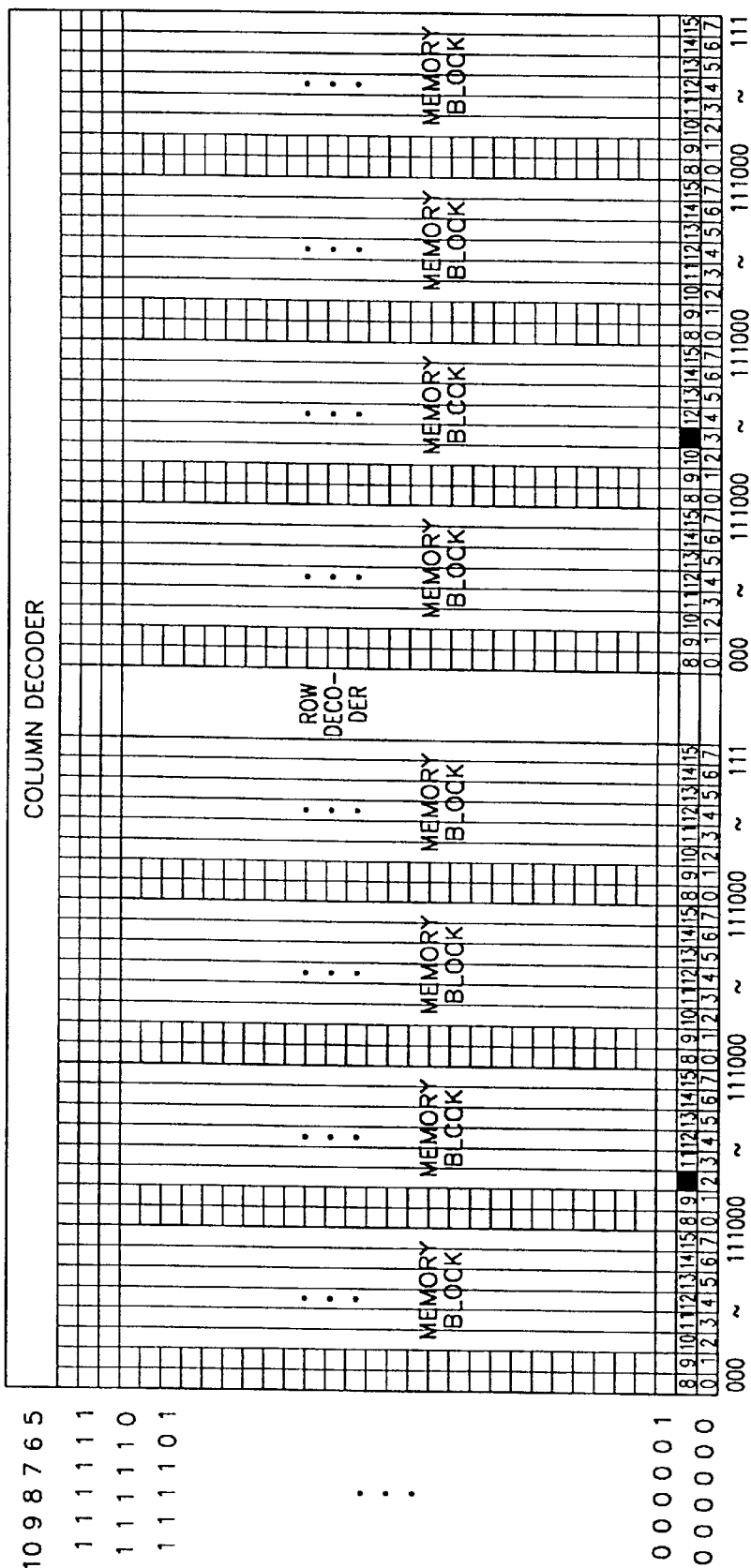

FIG. 3 contains a schematic diagram which illustrates a result of mapping the presence of faulty memory cells on a memory map using test data corresponding to the memory addresses shown in FIG. 1.

FIG. 4 is a flowchart showing a method for detecting faulty cells in a semiconductor memory device according to the present invention.

DESCRIPTION OF PREFERRED EMBODIMENTS OF THE INVENTION

The present invention now will be described more fully with reference to the accompanying drawings, in which preferred embodiments of the invention are shown. FIG. 1 contains a schematic circuit diagram which shows an apparatus for detecting faulty cells in a semiconductor memory device according to an embodiment of the present invention. The apparatus for detecting faulty cells according to the present invention includes a memory cell array 100 which includes a plurality of memory blocks 110 through 114, a column decoder 120, a row decoder 130, and a plurality of faulty cell detectors 140 through 144.

Referring to FIG. 1, the memory cell array 100 includes the plurality of memory blocks 110 through 114. Each of the memory blocks 110 through 114 includes a plurality of memory cells 116. A memory cell is addressed in each of the memory blocks 110 through 114, corresponding to a predetermined memory address consisting of a column address Cadd and a row address Radd. That is, if the memory cell array 100 consists of n memory blocks, n memory cells are addressed, corresponding to the predetermined memory address. For example, when the memory device shown in FIG. 1 performs a reading operation, data stored in the respective addressed memory cells is transmitted through bitlines 160 through 164 of the memory cells addressed in the respective memory blocks 110 through 114 corresponding to the predetermined memory address. The data transmitted to the bitlines 160 through 164 is output through input and output lines I/O1 through I/On.

To be specific, the column decoder 120 decodes the column address Cadd in the memory address input from the outside. The row decoder 130 decodes the row address Radd. That is, the memory address input from the outside addresses one memory cell in each of the plurality of memory blocks 110 through 114 according to the decoding result of the column decoder 120 and the row decoder 130.

The plurality of faulty cell detectors 140 through 144 correspond to the plurality of memory blocks 110 through 114 and detect current generated in the corresponding memory blocks 110 through 114. Also, the plurality of faulty cell detectors 140 through 144 compare currents Idet1 through Idetn detected from the corresponding memory blocks 110 through 114 to predetermined a reference current Iref and detect whether faulty memory cells are found in the addressed memory cells.

The faulty cell detectors 140 through 144 determine an addressed memory cell to be a faulty cell when the current detected from the corresponding memory block (Idet1 through Idetn) is larger than the reference current Iref and determine an addressed memory cell to be a normal cell when the detected current (Idet1 through Idetn) is less than or equal to the reference current Iref. The faulty cell detectors 140 through 144 output the determination results as test data to the outside.

For example, it is assumed that the faulty cell detectors 140 through 144 output "1" when the detected current is larger than the reference current Iref and output "0" when the detected current is less than or equal to the reference current Iref. In this case, it is noted that the addressed memory cell of the memory block corresponding to a faulty cell detector which outputs "1" is a faulty cell. Also, it is noted that the addressed memory cell of the memory block corresponding to a faulty cell detector which outputs "0" is a normal cell.

As a result, it is possible to correctly detect the positions of the faulty cells by the test data output from the faulty cell detectors 140 through 144.

The outputs of the plurality of faulty cell detectors 140 through 144 can be output through the corresponding data input and output lines I/O1 through I/On in response to a test selection signal Tsel, as shown in FIG. 1. The faulty cell detectors 140 through 144 output data of n bits generated in the bitlines of the addressed memory cells to the data input and output lines I/O1 through I/On, in response to the disabled test selection signal Tsel. Also, the faulty cell detectors 140 through 144 detect whether faulty cells are found in the addressed memory cells in response to the enabled test selection signal Tsel and output the detection result as the test data of n bits to the data input and output lines I/O1 through I/On.

Since the test data of n bits is output through the data input and output lines I/O1 through I/On, additional pins for outputting the test data are not required. As a result, memory blocks including faulty cells can be detected by the test data output to the data input and output lines I/O1 through I/On. It is possible to correctly detect the positions of the faulty memory cells by checking the memory address at the time the memory block including the faulty cells is detected. Each of the plurality of faulty cell detectors 140 through 144 preferably includes current detectors 152 and selectors 154.

In the faulty cell detector 140, the current detector 152 detects the current generated in the corresponding memory block 110 according to the memory address. The current detector 152 compares the magnitude of the current Idet1 detected from the memory block 110 to the magnitude of the reference current Iref and outputs the comparison result as the least significant bit in the test data of n bits.

The selector 154 receives the data transmitted to the bitline 160 of the addressed memory cell and the comparison result of the current detector 152. The selector 154 selects either the data transmitted from the bitline 160 or the test data generated by the current detector 152 and outputs the selected data to the data input and output line I/O1, in response to the test selection signal Tsel. Since the operations of the current detectors 152 and the selectors 154, which constitute the remaining faulty cell detectors 142 through 144, are the same as the operations of the current detector 152 and the selector 154 of the faulty cell detector 140, a detailed description thereof will be omitted.

The plurality of faulty cell detectors 140 through 144 can further include switches connected between the corresponding memory blocks and ground GND, and controlled in response to the test selection signal Tsel. When the test selection signal Tsel is enabled, switches 150 are turned off and the current generated in the memory block is detected by the current detectors 152. When the test selection signal Tsel is disabled, the switches 150 are turned on and the current generated in the memory block is sunk to the ground GND through the switches 150. Accordingly, when the test selection signal Tsel is disabled, the current detector 152 is bypassed.

As a result, when the test selection signal Tsel is disabled, the data stored in the addressed memory cell is output to the data input and output lines I/O1 through I/On through the bitlines 160 through 164, the current detectors 152 are bypassed by the switches 150, thus not affecting a data reading operation. Namely, when the memory device shown in FIG. 1 performs normal writing and reading operations, the plurality of current detectors 152 are bypassed by the switches 150. Therefore, it is possible to prevent the write and read operation speed of the memory device from decreasing due to the circuits such as the current detectors 152.

FIG. 2 is a circuit diagram showing the SRAM memory cell 116 which constitutes the SRAM memory cell array 100 shown in FIG. 1. Referring to FIGS. 1 and 2, the current detector 152 is connected to the G terminal of the memory cell shown in FIG. 2 and detects the current which flows to the G terminal. When the memory cell shown in FIG. 2 is a normal cell, the current is less than or equal to the reference current Iref. However, as shown in FIG. 2, when a MOS transistor M3 is faulty, excessive current which is larger than the reference current Iref flows to the G terminal. Therefore, the faulty cell detector shown in FIG. 1 detects the excessive current flowing to the G terminal and outputs a signal indicating that the addressed memory cell is a faulty cell to the data input and output terminal.

The operation of detecting faulty cells in the memory device shown in FIG. 1 will now be described in more detail. It is assumed that the memory cell array 100 shown in FIG. 1 consists of 8 blocks and inputs and outputs data of 8 bits in response to a memory address of 9 bits, for the convenience of explanation. The data input and output lines I/O1 through I/O8 correspond to the memory blocks 1 through 8. Also, it is assumed that three lower bits among the memory address of 9 bits are assigned to the column address Cadd and six upper bits are assigned to the row address Radd.

Table 1 shows the test data of 8 bits output to the data input and output lines I/O1 through I/O8 when the memory address is sequentially increased after controlling the memory device shown in FIG. 1 to be in a test mode. Here, a weight value is sequentially applied to the test data of 8 bits from the data input and output line I/O8 to the data input and output line I/O1. Namely, among the 8 bits, the most significant bit is the data output from the data input and output line I/O8 and the least significant bit is the data output from the data input and output line I/O1. At this time, data of '0' output to the data input and output lines I/O8 through I/O1 shows that the addressed memory cell is a normal memory cell. Data of '1' shows that the addressed memory cell is a faulty memory cell.

TABLE 1

| Memory address | Test data [I/O8 through I/O1] |
|---|---|
| 000000000 | 00000000 |
| 000000001 | 00000000 |
| 000000010 | 00000000 |
| . | . |
| . | . |
| . | . |

TABLE 1-continued

| Memory address | Test data [I/O8 through I/O1] |
|---|---|
| 000001010 | 00000010 |
| 000001011 | 00100000 |
| 000001100 | 00000000 |
| . | . |
| . | . |
| . | . |

Referring to FIG. 1 and Table 1, the method of detecting whether faulty cells exist in the memory cells addressed in the memory cell array and where the faulty cells are located will be described in detail.

Referring to Table 1, when the memory addresses are '000000000' through '000000010', all the test data items are '00000000'. Since all the test data items of 8 bits output to the data input and output lines I/O8 through I/O1 are '0', the memory cells addressed by the memory addresses '000000000' through '000000010' are normal memory cells. When the memory address is '000001010', the test data is '00000010'. At this time, since the test data output to the data input and output line I/O2 is '1', it is noted that a faulty cell is generated in the memory block 2. Also, it is detected that the address of the faulty cell is '000001010' (10).

Also, in Table 1, when the memory address is '000001011', the test data output to the data input and output lines I/O8 through I/O1 is '00100000'. Here, since the data output to the data input and output line I/O6 is '1', it is noted that a faulty cell is generated in the memory block 6. Also, it is detected that the address of the faulty cell is '000001011' (11). As mentioned above, whether the memory cell is faulty and where the faulty memory cell is located are correctly shown by the currently input memory addresses Madd and the data output from the data input and output lines I/O8 through I/O1.

FIG. 3 shows the result of mapping the presence of faulty memory cells on a memory map using the test data corresponding to the memory addresses shown in Table 1.

As described with reference to Table 1, when the positions of the faulty cells are mapped by the test data corresponding to the memory addresses, it is possible to know where the faulty memory cells are located in the memory cell array, as shown in FIG. 3. Referring to FIG. 3, it is noted that the faulty memory cells are the memory cell whose address is '000001010' (10) in the memory block 2 and the memory cell whose address is '000001011' (11) in the memory block 6. Since the positions of the faulty cells are correctly shown by the memory map, where the locations of the memory cells are mapped, it is possible to more easily analyze the faults of the faulty cells.

FIG. 4 is a flowchart showing a method of detecting faulty cells in a semiconductor memory device according to an embodiment of the present invention. Referring to FIGS. 1 and 4, the method of detecting the faulty cells according to the present invention is performed as in accordance with the following description.

In order to detect whether the memory cells 116 constituting the memory cell array 100 are faulty, the test selection signal Tse1 is enabled and the memory device is set to be in a test mode by the enabled test selection signal Tse1 (step 200). The memory addresses are applied (step 202). The currents generated in the plurality of memory blocks 110 through 114 by the memory cells addressed according to the memory addresses applied in the step 202 are detected (step 204). After step 204, it is determined whether the currents Idet1 through Idetn detected in the memory blocks 110 through 114 are larger than the reference current Iref (step 206).

In step 206, in the case of a memory block where the detected current is larger than the reference current Iref, the memory cell in the memory block addressed by the memory address is determined to be a faulty cell (step 208). In step 206, in the case of a block where the detected current is less than or equal to the reference current Iref, the memory cell in the memory block addressed by the memory address is determined to be a normal cell (step 210).

According to the apparatus for detecting the faulty cells in the semiconductor memory device of the present invention and the method therefor, it is possible to check whether addressed memory cells are faulty by detecting currents flowing through the plurality of memory blocks by the memory addresses. Therefore, it is possible to correctly detect the positions of the faulty memory cells. Also, since data indicating whether the memory cells are faulty are output through the data input and output lines in response to the test selection signal, it is possible to reduce the number of pins. Also, since the current detectors corresponding to the memory blocks are bypassed in response to the test selection signal, it is possible to prevent the operating speed from decreasing due to the current detectors during normal operation.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus for detecting faulty cells in a semiconductor memory device, the apparatus comprising:
    a memory cell array comprising a plurality of memory blocks, each of said memory blocks including a plurality of memory cells addressable by predetermined corresponding memory addresses, and each of said memory blocks being associated with an output line for outputting memory data from its associated memory block;
    a plurality of faulty cell detectors corresponding to the plurality of memory blocks for comparing currents generated in the memory blocks to a predetermined reference current, detecting whether addressed memory cells are faulty and generating a signal indicative of the comparison result; and
    a plurality of selection circuits associated with the plurality of memory blocks, each selection circuit receiving memory data and the signal indicative of the comparison result for the associated memory block for forwarding to the associated output line, the selection circuit forwarding one of the memory data and the signal indicative of the comparison result to the output line in response to a selection signal.

2. The apparatus of claim 1, wherein each of the plurality of faulty cell detectors comprises a current detector for detecting current flowing through the memory block according to the memory address, comparing the magnitude of the detected current with the magnitude of the reference current, and generating the signal indicative of the comparison result.

3. The apparatus of claim 2, wherein each of the plurality of faulty cell detectors further comprises a switch for bypassing the current detectors corresponding to the memory blocks in response to the selection signal being in a disabled state.

4. A method of detecting faulty cells in a semiconductor memory device comprising memory cell arrays, each of said memory cell arrays including a plurality of memory blocks, each of said memory blocks including a plurality of memory cells addressable by predetermined corresponding memory addresses, and each of said memory blocks being associated with an output line for outputting memory data from its associated memory block, the method comprising:
    (a) setting the memory device to be in a test mode;
    (b) applying the memory addresses;
    (c) detecting currents flowing through the plurality of memory blocks by memory cells addressed according to the memory addresses;
    (d) comparing the detected currents to a reference current to determine whether the detected currents are larger than a reference current;
    (e) determining a memory cell in a memory block addressed by a memory address to be faulty if the detected current is determined to be larger than the reference current;
    (f) determining a memory cell in a memory block addressed by a memory address to be a normal cell if the detected current is determined to be less than or equal to the reference current;
    (g) generating a signal indicative of whether a memory cell is determined to be defective;
    (h) applying memory data and the signal indicative of whether the associated memory cell is defective to inputs of a selection circuit, an output of the selection circuit applying a selected input to the output line; and
    (i) applying a selection signal to the selection circuit to select one of the memory data and the signal indicative of whether the associated memory cell is defective to be applied to the output line by the selection circuit.

5. An apparatus for detecting faulty cells in a semiconductor memory device, the apparatus comprising:
    a memory cell array comprising a plurality of memory blocks, each of said memory blocks including a plurality of memory cells addressable by predetermined corresponding memory addresses; and
    a plurality of faulty cell detectors corresponding to the plurality of memory blocks for comparing currents generated in the memory blocks to a predetermined reference current and detecting whether addressed memory cells are faulty, each of the plurality of faulty cell detectors comprising:
        a current detector for detecting current flowing through the memory block according to the memory address, comparing the magnitude of the detected current with the magnitude of the reference current, and outputting the comparison result;
        a selector for receiving data read from the bitline of the addressed memory cell according to the memory address, receiving the comparison result from the current detector, and outputting one of the read data and the comparison result of the current detector in response to the test selection signal.

6. The apparatus of claim 5, wherein each of the plurality of faulty cell detectors further comprises a switch for bypassing the current detectors corresponding to the memory blocks in response to a disabled test selection signal.

* * * * *